United States Patent [19]
Giannelis et al.

[11] Patent Number: 5,202,152
[45] Date of Patent: Apr. 13, 1993

[54] SYNTHESIS OF TITANIUM NITRIDE FILMS

[75] Inventors: Emmanuel P. Giannelis; Joseph L. Keddie; Y. Y. Shacham-Diamond, all of Ithaca, N.Y.

[73] Assignee: Cornell Research Foundation, Inc., Ithaca, N.Y.

[21] Appl. No.: 782,401

[22] Filed: Oct. 25, 1991

[51] Int. Cl.[5] .................... B05D 5/12; B05D 3/12; B05D 3/02
[52] U.S. Cl. ................. 427/108; 427/126.1; 427/126.2; 427/226; 427/240; 427/343; 427/377; 427/380
[58] Field of Search ........... 427/240, 226, 343, 126.1, 427/126.2, 108, 377, 388

[56]      References Cited
          U.S. PATENT DOCUMENTS

| | | | |
|---|---|---|---|
| 3,036,888 | 5/1962 | Lowe | 22/91 |
| 4,151,325 | 4/1979 | Welch | 428/432 |
| 4,361,598 | 11/1982 | Yoldas | 427/74 |
| 4,535,000 | 8/1985 | Gordon | 427/160 |
| 4,675,073 | 6/1987 | Douglas | 156/643 |
| 4,704,299 | 11/1987 | Wielonski et al. | 427/38 |
| 4,812,333 | 5/1989 | Micheli | 427/226 |
| 4,830,879 | 5/1989 | Debsikdar | 427/162 |
| 4,842,888 | 6/1989 | Halluska et al. | 427/126.4 |
| 4,885,188 | 12/1989 | Hawegawa et al. | 427/126.2 |
| 4,906,493 | 5/1990 | Laine | 427/226 |
| 4,948,762 | 8/1990 | Krumbe et al. | 427/228 |
| 4,966,812 | 10/1990 | Ashley et al. | 427/162 |
| 4,970,095 | 11/1990 | Bolt et al. | 427/226 |

OTHER PUBLICATIONS

"Nitridation of the Sol-Gel-Derived Titanium Oxide Films by Heating in Ammonia Gas"; Kanichi Kamiya and Tomoaki Nishijima; *J. Am Ceram. Soc.*, 73 [9] 2750-52 (1990).

"Preparation of Titanium Nitride and Titanium Carbonitride by the Preceramic Polymer Route"; Dietmar Seyferth and Gerard Mignani; *Journal of Materials Science Letters* 7 (1988) 487-488.

"Nitriding of Bulk Titanium and Thin Titanium Films in a $NH_3$ Low Pressure Plasma"; N. Laidani, et al.; *Applied Surface Science*, vol. 36, No. 1-4, pp. 520-529, Jan. 1989.

*Primary Examiner*—Janyce Bell
*Attorney, Agent, or Firm*—Bell, Seltzer, Park & Gibson

[57]      ABSTRACT

A substantially stoichiometric film of titanium nitride is provided by heating a substrate upon which a solution containing titanium has been applied at a substantially ambient temperature to provide a gel-film containing titanium on the surface of the substrate in an ammonia atmosphere. The substrate is heated to a temperature at which the titanium in the titanium-containing gel-film is substantially completely transformed to a substantially stoichiometric titanium nitride film, and at a rate of temperature change that is great enough to prevent the formation of nonstoichiometric titanium nitride compounds or other undesired titanium compounds in the resulting titanium nitride film. The invention is particularly suited for use in microelectronic devices.

33 Claims, 4 Drawing Sheets

SYNTHESIS OF TITANIUM NITRIDE FILMS

FIELD OF THE INVENTION

This invention relates to a method for producing thin films of titanium nitride on the surface of a substrate. More particularly, this invention relates to a method for producing a substantially stoichiometric titanium nitride film on the surface of a substrate by heating a titanium-containing solution applied to the surface of a substrate in ammonia at a rate of temperature change great enough to prevent the formation of undesired titanium compounds.

BACKGROUND OF THE INVENTION

Titanium nitride exhibits a wide variety of characteristics, including extreme hardness, abrasion resistance, high melting temperature, high corrosion resistance and electrical conductivity. Because of these various characteristics, titanium nitride films are extremely important in a wide range of applications. Titanium nitride films are used, for example, as wear-resistent coatings for cutting tools and other mechanical parts, and for high temperature structural materials. An increasingly important use of titanium nitride films is in the microelectronic industry. Titanium nitride films are especially useful as diffusion barriers in electronic devices, particularly against diffusion between aluminum and silicon, and as planarization and interconnect material, particularly in multi-level metallization schemes.

There are a wide variety of techniques for synthesizing titanium nitride films on different substrates. Prior techniques for synthesizing titanium nitride films include chemical vapor deposition and sputtering, such as that taught in H. Itoh et al., "Chemical Vapour Deposition of Corrosion-Resistant TiN Film to the Inner Walls of Long Steel Tubes," J.Mat.Sci., 21, 751–56 (1986) and D. S. Williams et al., "Nitrogen, Oxygen, and Argon Incorporation During Reactive Sputter Deposition of Titanium Nitride," J.Vac.Sci.Technol. B, 5, 1723–29 (1987). Another prior technique used to apply a titanium nitride film to the surface of a substrate is ion implantation, such as that taught in B. Rauschenbach, "Formation of Compounds by High-Flux Nitrogen Ion Implantation in Titanium," J.Mat.Sci., 21, 395–404 (1986), M. Belii et al., Formation of Chemical Compounds by Ion Bombardment of Thin Transition Metal Films," Phys.Status Solidi A, 45, 343–52 (1978), and P. A. Chen et al., "Titanium Nitride Films Prepared by Ion Implantation," Thin Solid Films, 82, L91–92 (1981).

Yet another technique is the pyrolysis of preceramic polymers. D. Seyferth et al., "Preparation of Titanium Nitride and Titanium Carbonitride by the Pre-ceramic Polymer Route," J.Mat.Sci.Lett., 7, 487–88 (1988)). Kamiya, et al., "Nitridation of the Sol-gel Derived Titanium Oxide Films by Heating in Ammonia Gas," J.Am.Cerm.Soc., 73, 2750–52 (1980), disclose the synthesis of titanium nitride films by slowly heating sol-gel derived titanium oxide films in ammonium gas.

These prior procedures, however, can have inherent limitations. For example, the surface size or shape of a substrate can limit the use of many of these known techniques, in particular chemical vapor deposition, sputtering, and ion implantation. These limitations limit the use of titanium nitride films particularly where planarization and/or the filling of vias in multilevel metallization is required. Significantly, these techniques can also result in titanium nitride films which contain high levels of impurities, such as oxygen, which in turn adversely affect the desired characteristics of the final product. For example, the level of oxygen in the nonstoichiometric films taught by Kamiya et al result in decreased conductivity and decreased barrier efficiency.

OBJECT AND SUMMARY OF THE INVENTION

It is therefore an object of the invention to provide a method for producing substantially stoichiometric titanium nitride films wherein the amount of impurities in the film are minimized and the desirable characteristics of the films, such as conductivity and barrier diffusion properties, are maximized. It is a further object of the invention to provide a method for producing titanium nitride films where substrate surface size and shape limitations prohibit the use of other techniques.

The present invention provides a method for producing a substantially stoichiometric film of titanium nitride on the surface of a substrate which is particularly suited as a diffusion barrier and as a planarization and interconnect material in electronic devices. In the method of the invention, a solution containing titanium is applied to the surface of a substrate at a substantially ambient temperature to provide a gel-film containing titanium nitride on the surface of the substrate. The substrate is heated in an ammonia atmosphere to a temperature at which the titanium in the titanium-containing gel-film is substantially completely transformed to a substantially stoichiometric titanium nitride film, and at a rate of temperature change that is great enough to prevent the formation of nonstoichiometric titanium nitride compounds or other undesired titanium compounds in the resulting titanium nitride film.

Preferably the step of heating the substrate to a temperature at which the titanium in the titanium-containing gel-film is substantially completely transformed to a substantially stoichiometric titanium nitride film comprises heating the substrate to a temperature of at least about 700° C., and more preferably to a temperature of at least about 900° C. Preferably the step of heating the substrate at a rate of temperature change that is great enough to prevent the formation of nonstoichiometric titanium nitride compounds or other undesired titanium compounds in the resulting titanium nitride film comprises heating the substrate at a rate of temperature change of at least about 50° C. per minute, and more preferably at a rate of temperature change of at least about 70° C. per minute. Advantageously the substrate is maintained at the temperature to which it is heated for at least about thirty minutes to about six hours, and preferably for at least about thirty minutes to about one hour. The substrate is then cooled to substantially ambient temperature at a rate of temperature change substantially equal to the rate of temperature change used to heat the substrate.

In a particularly preferred embodiment of the invention, the method also includes the step of predensifying the titanium containing gel-film on the surface of the substrate upon which the titanium containing solution has been applied before heating the substrate. In this embodiment of the invention, the titanium containing gel-film is predensified by heating the substrate upon which the titanium containing solution has been applied to a temperature of from about 400° C. to about 900° C. at a rate exceeding 1000° C. per minute in hydrogen gas.

For example, the titanium containing gel-film may be predensified by rapid thermal annealing.

In the invention, the step of applying a titanium containing solution to the surface of a substrate to provide a gel-film containing titanium on the surface of the substrate comprises applying a solution of titanium alkoxide in solvent. The titanium alkoxide has the formula Ti(OR)$_4$, wherein R is an alkyl having 1 to 6 carbon atoms, and preferably wherein R is an alkyl having 2 to 4 carbon atoms. The solvent used is an aliphatic, cycloaliphatic or aromatic compound containing from 1 to 20 carbon atoms and at least one functional group consisting of ether and hydroxyl, and is preferably selected from the group consisting of C$_2$–C$_5$ saturated or unsaturated alcohols.

The titanium containing solution may be applied to the surface of the substrate in any of the ways known in the art, including spraying, dipping, or spin coating the solution onto the substrate. In a preferred method the solution is applied by pouring the solution on the substrate and spinning the substrate at rate of about 1000 to 6000 rpm.

The method can be used with a variety of substrates, including metal substrates, non-metal substrates, ceramic substrates, glass substrates, and polymer substrates. The method is particularly useful for substrates used in the microelectronic industry, such as silicon wafers.

The invention also provides a substrate having a thin film substantially stoichiometric coating of titanium nitride on the surface thereof. Preferably the substrate has a thin film of substantially stoichiometric titanium nitride thereon and a resistivity of no more than about 450 $\mu\Omega$.centimeters at a substantially ambient temperature, and more preferably a resistivity of no more than about 200 $\mu\Omega$.centimeters at a substantially ambient temperature.

The present invention thus provides an effective and efficient method for producing substantially stoichiometric titanium nitride films on the surface of a substrate. The method is particularly useful for producing a diffusion barrier and a planarization and interconnect material for electronic devices.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION OF THE INVENTION

Figure 1:
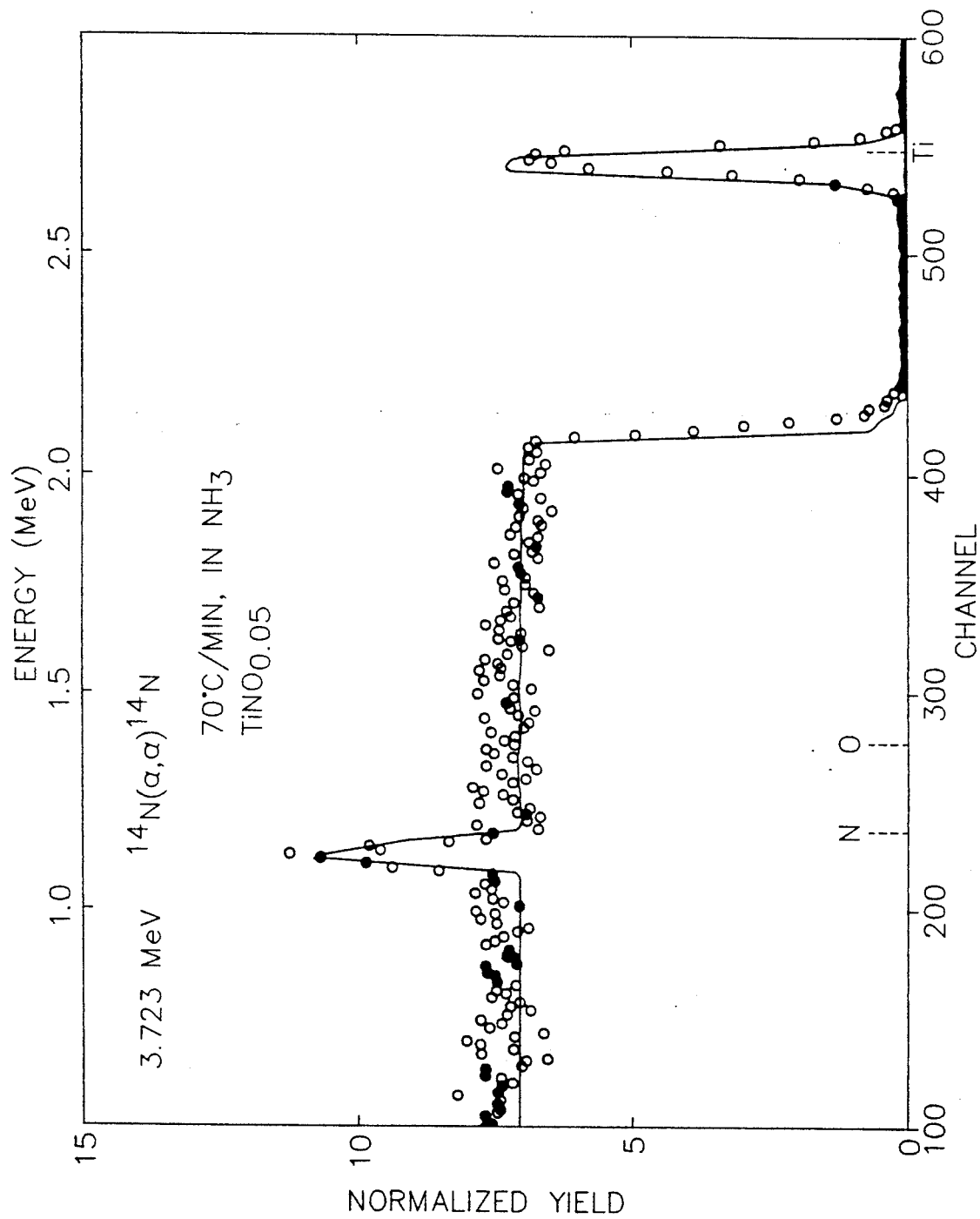
FIG. 1 is the nuclear resonance spectrum for an ethoxide-derived film heated at 70° C. per minute in ammonia (NH$_3$)

Prior to producing the titanium films of the invention, a titanium dioxide film is prepared for application to the surface of the substrate. The titanium dioxide is preferably prepared from a solution of titanium alkoxide in solvent, said titanium alkoxide having the formula Ti(OR)$_4$ wherein R is alkyl containing 1 to 6 carbon atoms. The titanium alkoxides of the invention are readily prepared by known methods, e.g., by reaction of titanium chloride with an appropriate alcohol. Titanium alkoxides containing 2 to 4 carbon atoms, such as titanium (IV) ethoxide, titanium (IV) n-propoxide, titanium (IV) i-propoxide, titanium (IV) n-butoxide, titanium (IV) s-butoxide, and titanium (IV) t-butoxide, are preferred and are commercially available. Other suitable alkoxides include, for example, titanium (IV) isoamyloxide and titanium (IV) n-capryloxide.

The titanium alkoxide is added to a solvent comprising that selected from the group consisting of aliphatic, cycloaliphatic and aromatic compounds containing from 1 to 20 carbon atoms and at least one functional group consisting of ether and hydroxyl. C$_2$–C$_5$ saturated or unsaturated alcohols are preferred. Such alcohols include, for example, ethanol, n-propanol, 2-propanol, n-butanol, sec-butanol, t-butanol, vinyl alcohol, allyl alcohol, crotyl alcohol, 1-butene-4-ol and 3-butene-2-ol. Other suitable solvents include, for example, methanol, cyclohexanol, dibutylether, phenol, benzyl alcohol, tertahydrafuran and dodecanol. When titanium (IV) ethoxide is the titanium alkoxide, preferably the solvent is t-butanol.

Typically the solvent is from about 40% to about 90% by volume of the solution thus prepared. The amount is dependent upon the particular solvent used and the particular alkoxy groups present. Water can be added as a solution with C$_2$–C$_4$ alcohol, such as a solution containing from 0.5 to 10 volume percent water with the remainder being alcohol. Acid is optionally used at a level of 0.001 to 2 moles per mole of alkoxide. Preferred acids are hydrochloric acid, nitric acid and acetic acid.

The mixture is heated to a temperature ranging from about 10° C. to 70° C. for a time period ranging from about 0.5 to 48 hours to cause hydrolysis and condensation to provide a solution, also referred to in the art as a sol because of the dye and nature of the polymeric constituent of the solution. The mixture can be diluted with the solvent if necessary to prepare a formable sol. Preferably the mixture is heated at a temperature of from about 25° C. to about 65° C. for a time period of from about 0.75 to about 2.5 hours.

Following preparation of the titania sols, the sol is formed into a film onto the surface of a substrate. Advantageously the sol is filtered to remove any particulates before it is applied to the surface of the substrate. The sol may be applied as a film in any of the ways known in the art, including dip coating, spraying, spin casting, or smearing. Advantageously the sol is applied to the surface of the substrate by spin casting onto the substrate, such as a photoresist spinning means, by pouring the sol on the substrate and spinning at 1000 to 6000 rpm.

The sols may be applied to a variety of substrates, including those of metal such as steel, non-metals such as silicon wafers, ceramics such as MgO or quartz, glass such as barium-silicate and polymers such as polycarbonate. The substrates are preferably cleaned before depositing the film by immersion in solvents with or without ultrasonic treatment. For example, silicon wafers are cleaned by stripping of native oxide by immersion in HF followed by cleaning by immersion in a solution of methanol and acetone. Barium-strontium glass substrates are readily cleaned by successive immersions in trichlorofluoroethane, nitric acid, and a solution of methanol and acetone, each in an ultrasonic bath.

After the sol is applied to the surface of a substrate, the sol can be described as a sol-gel or gel-film, in that it is no longer a sol but is not yet a solid film. The substrate with the gel-film is placed in a source of nitrogen, preferably in an ammonia atmosphere. Advantageously the substrate is placed in a flowing ammonia atmosphere of at least about 99.99% ammonia. The gaseous ammonia may be provided in any of the ways known in the art. For example, the substrate can be placed in an evacuated tube of quartz which is filled with flowing ammonia gas.

Following placement in the ammonia atmosphere, the substrate is heated in the gaseous ammonia to a temperature at which the titanium in the gel-film is substantially completely transformed to a substantially stoichiometric titanium nitride film. Preferably the substrate in the presence of gaseous ammonia is heated to a temperature of at least about 700° C., and most preferably to a temperature of at least about 900° C.

The substrate must be heated in the ammonia atmosphere at a rate of temperature change that is great enough to prevent the formation of nonstoichiometric titanium nitride compounds or other undesired titanium compounds. The substrate is heated at a rate of temperature change of at least about 50° C. per minute, and preferably at a rate of temperature change of at least about 70° C. per minute. The rate of temperature change is critical for the formation of the substantially stoichiometric titanium nitride films of the invention. In contrast, in normal sol-gel processing, a slow heating rate, e.g., 0.1° to 10 ° C. per minute, is considered important to prevent cracking.

While the applicants do not wish to be bound to any particular theory or explanation of the invention, it is believed that at a rapid heating rate ammonia is more readily disassociated and the metal-oxygen bonds are more reactive than at a lower heating rate. Nitridation is believed to be enhanced as a higher nitrogen/metal ratio occurs and as reduced titanium sites that act as better Lewis acids are created, which in turn enhances chemical reactivity with bases. Therefore, the overall effect of a fast heating rate is believed to eliminate more oxygen and to enhance the reactivity of the oxide towards nitridation. The resultant films have a low oxygen content and thus lower resistivity values.

Once obtained, the temperature is maintained for thirty minutes to six hours, preferably for about thirty minutes to about one hour. This insures that the reaction is substantially complete. The substrate is then cooled to ambient temperature, e.g., room temperature or about 25° C. The method of cooling is not critical, but preferably the rate of cooling is the same as the heating rate.

In a particularly preferred embodiment of the invention, the gel-film on the substrate is predensified before it is heated in gaseous ammonia. Advantageously the gel-film on the substrate is predensified using rapid thermal annealing (RTA) in hydrogen gas. In this embodiment of the invention, the sols are prepared as described above, applied to the surface of the substrate to provide a gel-film on the surface of the substrate, and predensified by heating to a temperature ranging from 400° C. to 900° C. at a rate exceeding 1000° C. per minute. Preferably the heating is to a temperature from about 700° C. to about 900° C. and is carried out at a rate exceeding 7500° C. per minute. Devices for heating at a rate of temperature of greater than 8000° C. per minute are known in the art and are readily available. One example of a rapid thermal annealer useful for the present invention is that sold under the name Heatpulse 410, from AG Associates of Sunnyvale, Calif.

Once obtained, the temperature is maintained for 1 second to sixty minutes, preferably for 1 to 5 minutes. The substrate and densified gel-film are then cooled to room temperature. The method of cooling is not critical, but preferably the rate of cooling is the same as the heating rate, as are readily carried out by the water and gas cooling means incorporated in the above-named rapid thermal annealer.

The resulting product of the invention is a substrate having a thin film substantially stoichiometric coating of titanium on the surface thereof. Preferably the thin films thus prepared have a resistivity of no more than about 450 $\mu\Omega$.cm, and most preferably a resistivity of no more than about 200 $\mu\Omega$.cm when the gel-film coating is predensified by RTA. The films are especially useful as diffusion barriers, planarization material, interconnect material, and the like, in electronic devices.

The following examples serve to illustrate the invention but are not intended to be limitations thereon.

EXAMPLE 1

Preparation of the Samples

Two titania sols were prepared by dissolving titanium isopropoxide and titanium ethoxide, available from Aldrich Chemical Co., Milwaukee, Wis., in n-propanol and t-butanol, respectively, and adding to these solutions an alcohol-water mixture. Silicon (100) wafers cleaned with methanol and acetone and stripped of the native oxide were provided. The titania films were deposited on the silicon wafers by spinning the sols at 2000 rpm thereon. For resistivity measurements, films were deposited on PECVD $SiO_2$ on Si.

Samples were placed in an evacuated quartz tube fitted with ground glass stopcocks, and the tube was filled with 99.99% $NH_3$ flowing at a constant rate of 80 cc/min. Nitridation was performed using a constant heating rate of either 1, 10 or 70 ° C./min to 900° C., followed by a 1 hour hold and cooling at the same rate as heating. As-deposited films were approximately 1300 Å and reduced to roughly half this thickness after densification and nitridation.

EXAMPLE 2

Preparation of Analysis of Resistivity and Oxygen Content

The Concentration of oxygen was measured using $^{16}(\alpha,\alpha)^{16}O$ nuclear resonance at 3.05 MeV. $^{14}N(\alpha,\alpha)^{14}N$ nuclear resonance was performed at 3.59 MeV, as described in J. O. Olowolafe et al., "Effects of oxygen in $TiN_x$ on the Diffusion of Cu in Cu/TiN/Al and Cu/$TiN_x$/Si Structures," Appl.Phys.Lett., 58, 469–71 (1991) and J. Li et al., "Quantitative Characterization of Oxygen, Nitrogen, and Carbon in Ceramic Thin Films by Elastic Resonance Techniques," J.Mat.Res., submitted. An Auger spectrometer equipped with an Ar+ source was used for depth profiling. X-ray diffraction patterns were obtained using a diffractometer (CuK$\alpha$ radiation) equipped with a thin film attachment, available from Scintag, Model PADX, Scintag, Inc., Santa Clara, Calif. DC electrical conductivity measurements were performed with a four-point probe in the range of $10^{-4}$ to 1 Ma.

Samples for transmission electron microscopy (TEM) analysis were prepared by spin-casting on single crystal NaCl. After a 60° C. heat treatment, the salt substrate was dissolved in deionized water, and the film was collected on a copper TEM grid. The free standing thin films were subsequently annealed in $NH_3$, as already described.

EXAMPLE 3

Analysis of Resistivity and Oxygen Content.

Nitridation of the sol-gel deposited $TiO_2$ films at 900° C. results in titanium nitride (TiN) films containing varying amounts of oxygen, depending primarily on the nitridation rate. Those prepared with a nitridation rate of 70° C. per minute exhibited the metallic gold color characteristic of TiN, whereas those with rates of 1° C. per minute were dull, dark purple. FIG. 1 shows the $^{14}N(\alpha,\alpha)^{14}N$ nuclear resonance spectrum for an ethoxide-derived film heated at 70° C. per minute in $NH_3$. Using a computer simulation program, as described by L. Doolittle, "Algorithms for the Rapid Simulation of Rutherford Backscattering Spectra," Nucl.Instru.Methods, B9, 344 (1985), the experimental data was fitted to a chemical composition of $TiNO_{0.005}$.

Figure 2:
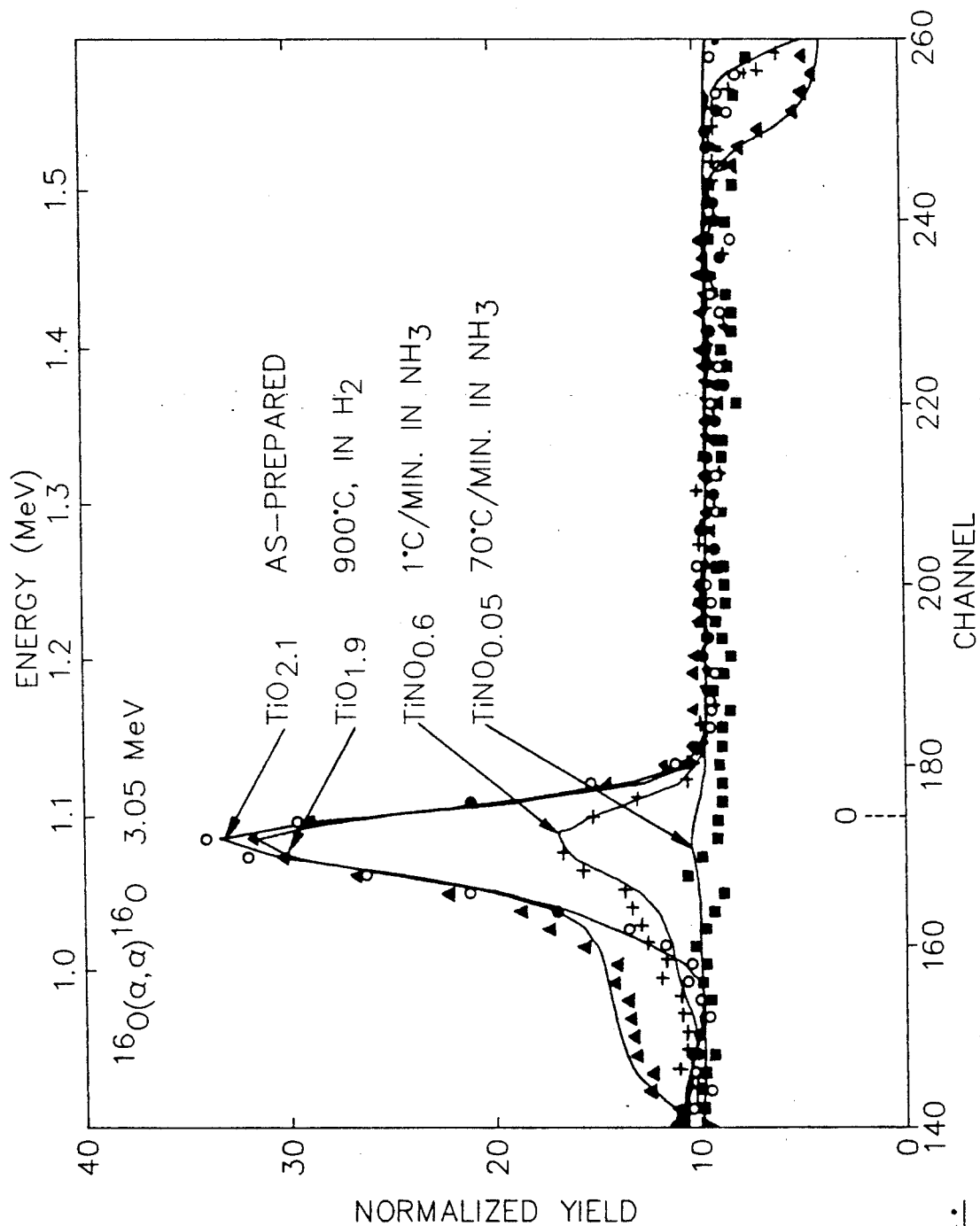
FIG. 2 is a similar spectrum for a series of ethoxide-derived titanium dioxide films (TiO$_2$)

FIG. 2 shows the oxygen peaks for a series of ethoxide-derived $TiO_2$ films. The spectrum with the highest amount of oxygen corresponds to the as-deposited titania film. The oxygen stoichiometry is slightly higher than two, since the film contains small amounts of hydroxyl and unhydrolysed organic groups. The concentration of oxygen decreases as the heating rate in ammonia increased from 1° to 70° C. per minute. The oxygen concentrations are 23 and 2 at%, respectively. Table I summarizes the chemical compositions obtained using oxygen resonance for various nitridation rates and the two precursors.

Figure 3:
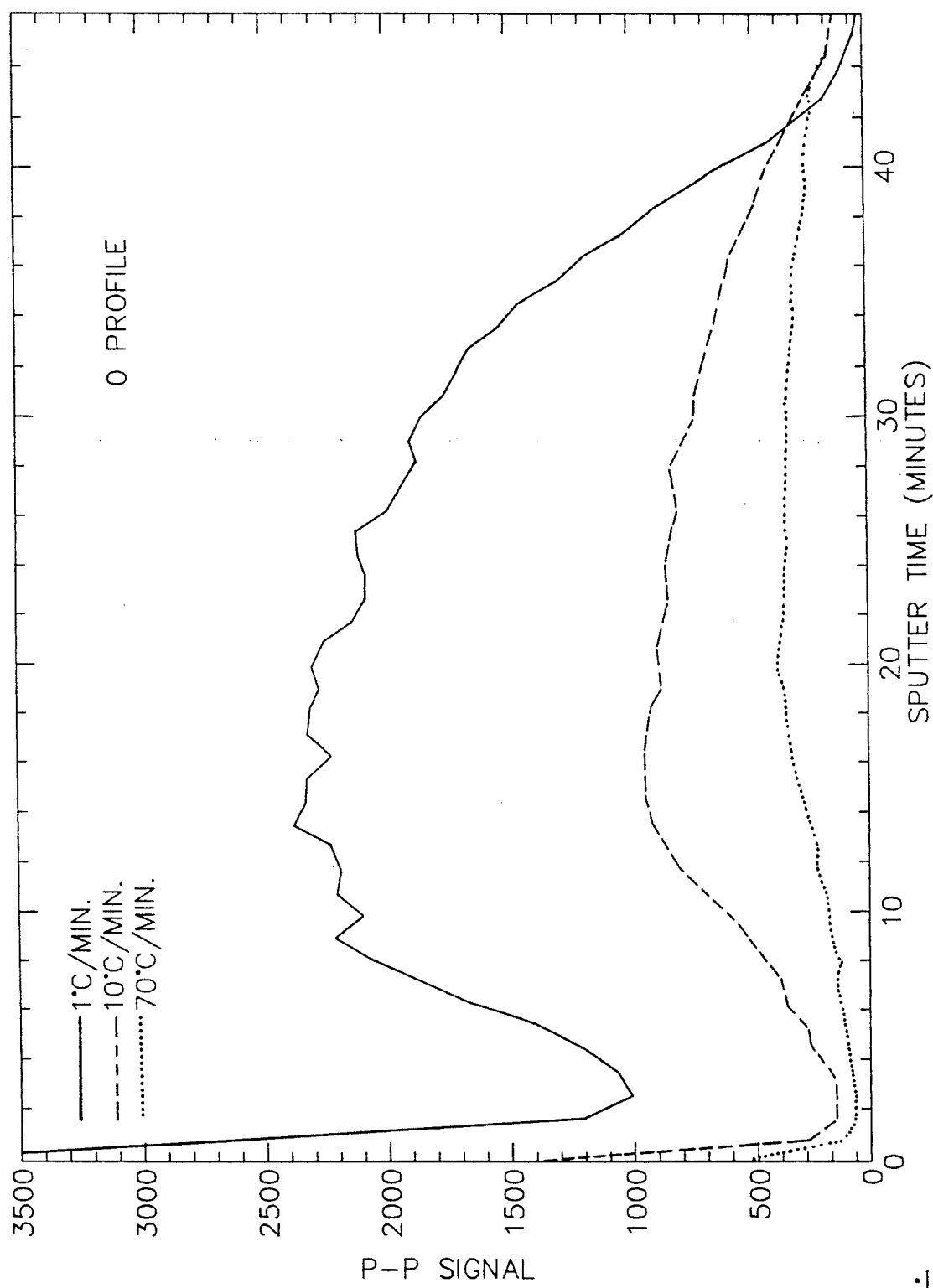
FIG. 3 is an auger depth profile of the ethoxide-derived TiO$_2$ films.

Auger depth profiling was used to examine the compositional homogeneity of the films. While the amount of oxygen is relatively low when a fast nitridation rate is used, a substantial increase is observed for films nitrided at 1° and 10° C. per minute, as shown in FIG. 3. In all three samples, the oxygen content is lower at the surface and increases closer to the substrate. This oxygen concentration gradient is much steeper for the slower nitridation rates, the steepest of which is observed for the film heated at 1° C. per minute. Ti and N composition profiles show the opposite trend.

Figure 4:
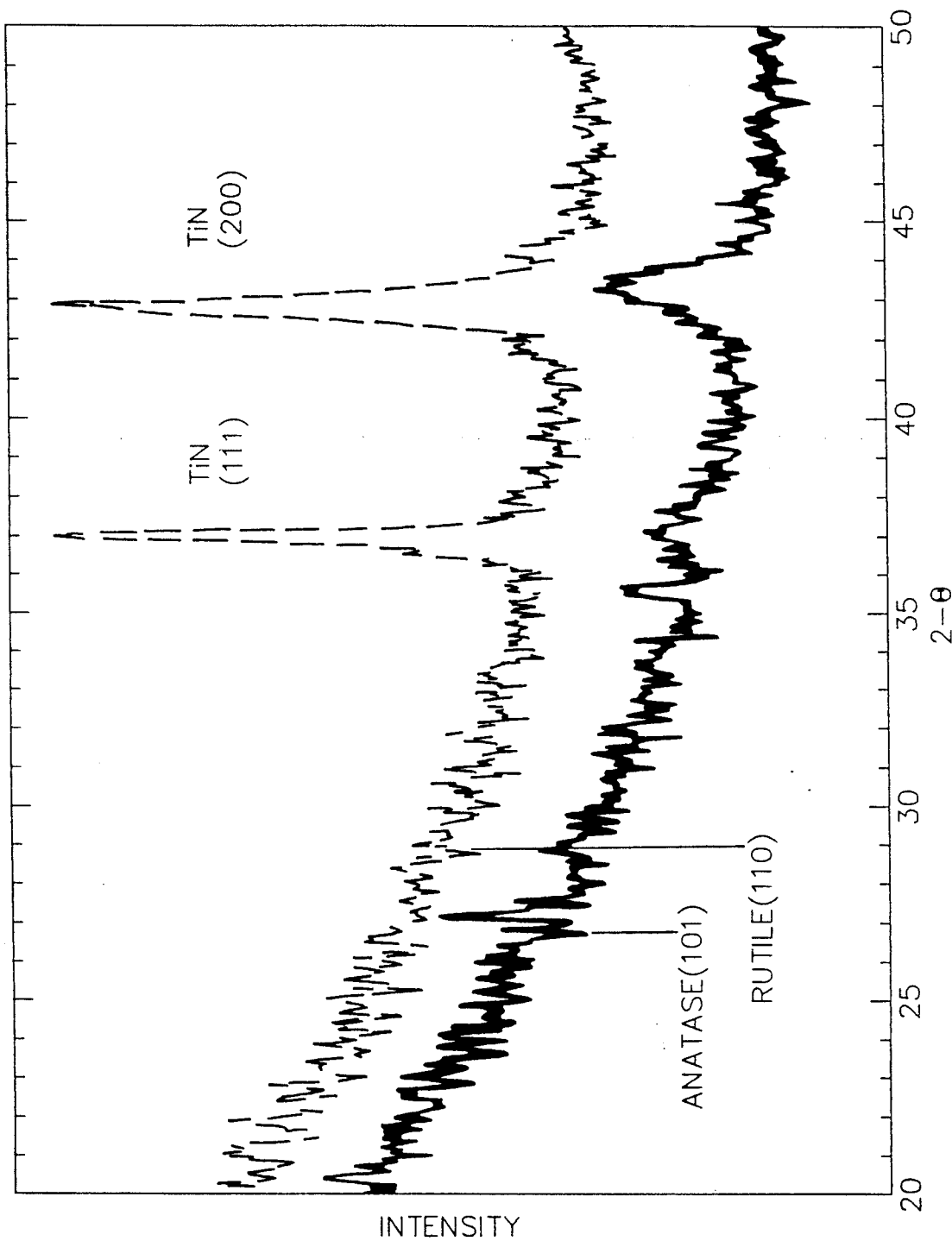
FIG. 4 is an x-ray diffraction pattern for several of the titanium nitride films evaluated with respect to the present invention.

Although the x-ray diffraction patterns for ethoxide-derived films nitrided at 1° and 70° C. per minute are almost identical, those for films derived from titanium isopropoxide are strongly affected by the nitridation rate, as shown in FIG. 4. The fast nitridation rate results in a pattern with sharp TiN peaks. In contrast, the sample that was slowly heated exhibits only broad, shallow TiN diffraction peaks in addition to peaks characteristic of anatase and rutile.

TEM analysis of the ethoxide-derived films confirms the XRD data indicating similar crystal size and microstructure for films nitrided at different heating rates. The average grain size of TiN films nitrided at 1° and 70° C. per minute is 14±6 nm and 18±7 nm, respectively. Both samples appear dense and free of any voids. Electron diffraction indicates that no phase (e.g. anatase or rutile) other than TiN is present.

Electrical resistivities of the films also vary with the nitridation rate. Films that contain the least amount of oxygen, that is, films prepared with the fastest heating rate, exhibit the lowest resistivity, as shown in Tables I and II. Densification of the films prior to nitridation, or predensification, increases the electrical conductivity of the films. The atmosphere under which the predensification was carried out also affected the conductivity. The lowest resistivity, 200 $\mu\Omega$ cm, was obtained when the sample was predensified by rapid thermal annealing (RTA) in $H_2$ for 60 seconds at 900° C. using the Heatpulse 410 available from Ag Associates, Sunnyvale, Calif. RTA in $H_2$ forms the reduced oxide, $TiO_{1.9}$, as shown in FIG. 2. For comparison, literature values range from 50 to 200 $\mu\Omega$ cm, varying with the oxygen content of the film and the deposition conditions, as reported by D. S. Williams et al., "Nitrogen, Oxygen, and Argon Incorporation During Reactive Sputter Deposition of Titanium Nitride," J.Vac.Sci.Tech. B, 5, 1723-29 (1987). Films nitrided at temperatures as low as 700° C. formed TiN, as observed by x-ray diffraction, although resistivities were an order of magnitude higher than films prepared at 900° C.

TABLE I

Effect of Heating Rate on Chemical Composition

| Precursor/Solvent | Heating Rate | | |
|---|---|---|---|
| | 1° C./min* | 10° C./min | 70° C./min* |
| Ti(Opr$^i$)$_4$/n-PrOH | TiNO$_{0.5}$ | TiNO$_{0.35}$ | TiNO$_{0.1}$ |
| Ti(Oet)$_4$t-ButOH | TiNO$_{0.6}$ | — | TiNO$_{0.05}$ |

*Films were predensified using RTA at 900° C. in $H_2$.

TABLE II

Effect of Heating Rate on Resistivity

| Precursor/Solvent | Resistivity ($\mu\Omega$cm) Heating Rate | | |
|---|---|---|---|
| | 1° C./min* | 10° C./min | 70° C./min* |
| Ti(Opr$^i$)$_4$/n-PrOH | 8 × 10$^5$ | 1150 | 430 |
| Ti(Oet)$_4$t-ButOH | >1 × 10$^7$ | 860 | 430 |

*Films were predensified using RTA at 900° C. in $H_2$.

EXAMPLE 5

Use of the Films as Planarization and Interconnect Material

Because spin-on materials combine the self-planarizing properties of liquids with the properties of the solids after they are annealed, the films of the invention were evaluated for use as planarization and interconnect material. An Ultra-Large-Scale-Integration (ULSI) application model was selected for evaluation. Planarization is particularly desirable in these applications, and spin-on conductors can be used for contact filling where, as sols, they deposit material much thicker in the via-contact hole than on the contact shoulder.

In the model, titanium nitride films were prepared by dissolving titanium (IV) ethoxide in t-butanol (3:1 by volume) and heating at 60° C. for 1 hour. The solution was then diluted with additional t-butanol in a 2:1 by volume ratio or greater, depending on the film thickness desired. The titania films were deposited on wafers by spinning the sols at 2000 rpm and consolidated by treating with heat for 30 seconds at 400° C. Thicker films were obtained with successive depositions.

The samples were placed in an evacuated quartz tube fitted with ground glass stopcocks. The samples were then heated to 900° C. and held for 1 hour while 99.99% $NH_3$ flowed through the tube at a rate of 80 cc/minute.

To evaluate the films, test wafers with metal contacts to n+ polysilicon were produced in which a contact hole opening and a patterned top metal were used as a mask to the TiN film. Two processes were devised to test the electrical properties of via-contacts with the nominal size down to 0.5 μm by 0.5 μm and filled with conducting spin-on material (CSOM), prepared as described above. In the first, a non-etchback process was used. A first conducting layer of phosphorus doped poly-silicon (430 nm thick; RS=331Ω per square) was deposited on a 520 nm thick thermal silicon-dioxide layer and patterned. A 850 nm thick PECVD silicon dioxide layer was deposited on the poly-silicon and contact holes were opened by RIE with $CHF_3/O_2$ (30 sccm/1 sccm) at 30 Mt. One to five layers of the CSOM were applied in a liquid (sol) form by dispensing over the silicon by a standard spin-casting process. The layers were cured at low temperatures after each coating. After deposition, the CSOM was nitrided to form TiN. This was followed by sputter deposition of a 420 nm thick aluminum layer and patterning. Prior to the metal deposition, the samples were backsputtered with argon to remove any contamination from the surface. Finally the TiN was etched in $CF_4$ using aluminum as a mask so that TiN was left only in areas covered with aluminum.

In the second process, an etchback step was added to remove the TiN from outside the contacts and to improve the planarization. The TiN was planarized before or after nitridation using an anisotropic $CF_4$ plasma etchback that removes the interlevel dielectric and the spin-on material at the same rate.

EXAMPLE 6

Analysis of the ULSI Application

The electrical properties of the wafers prepared using the non-etchback process were measured. The specific resistivity of the TiN of that specific run was about 700 μΩ.cm. Contact resistance, indicated as $R_c$, measured about 47Ω for the 1μΩ X 1 μΩ contacts (standard deviation of 10.7Ω). After further annealing the wafers at 450° C. in $N_2/H_2$ (4%) for 30 minutes, the $R_c$ of a 1μΩ X 1 μΩ (nominal) via-contact through a 1μΩ thick inter-metal PECVD oxide measured about 6.9Ω (standard deviation of 1.1Ω). The resistance of the contacts were measured using Kelvin probe. The thin-film sheet resistance, $R_s$, was 25Ω per square for an 80 nm thick layer, as measured by a four point probe. The equivalent bulk-resistivity assuming a uniform layer is as low as $2 \cdot 10^{-4}$ Ω.cm. In contrast, annealing in an oxygen ambient, results in an insulating titanium-oxide with a high bulk resistivity, and annealing in hydrogen or in vacuum, gives titanium-oxide with a resistivity of about $10^{-2}$ to $10^{-1}$ Ω.cm.

The step-coverage of the overlying metal of the structures of the model was simulated by SAMPLE (SAMPLE User guide, version 1.6a, publication of the Electronics Research Labs, Department of Electrical Engineering and Computer Science, U.S. Berkeley, Berkeley, CA, 1985). The SAMPLE simulation was for a 0.5 μm thick metal layer deposited by sputtering on a narrow trench, both without and with via filling of spin-on conductor of the invention. The analysis showed that the coverage of the top metal is improved even when the via-contacts are partially filled with the conducting spin-on material. Thus the method of the invention can be used to produce devices with improved step-coverage, planarization, and via-contact filling.

EXAMPLE 7

Use of the Films as Diffusion Barriers

The reactions between TiN films prepared as described in Example 5 and copper metallization were also evaluated. Copper films were evaporated onto TiN-coated silicon substrates to a thickness of approximately 3000A. The Cu/TiN/Si structures were annealed in a vacuum furnace with a base pressure of $1 \times 10^{-7}$ torr for one hour at temperatures ranging from 500° C. to 750° C.. These films were analyzed by X-ray diffraction (XRD), scanning electron microscopy (SEM), and Rutherford backscattering spectrometry (RBS).

Cu/SO-TiN/$SiO_2$ structures were stable at 500° C. and did not exhibit interdiffusion or adhesion problems. Adding a thin evaporated titanium layer (approximately 20 Å) between the copper and the titanium nitride film promoted adhesion of copper to titanium nitride without compromising the barrier properties of the latter. The Cu/Ti/TiN/Si structure was metallurgically stable up to 750° C. The analysis demonstrates that the conducting spin-on material of the invention also can be used for diffusion barrier applications, particularly against copper drift, as demonstrated here.

In the specification, there have been disclosed typical preferred embodiments of the invention and although specific terms are employed, they are used in a generic and descriptive sense only and not for purposes of limitation, the scope of the invention being set forth in the following claims.

We claim:

1. A method of producing a substantially stoichiometric film of titanium nitride on the surface of a substrate, in which the film is particularly suitable for diffusion barriers and planarization and interconnect materials in electronic devices, the method comprising:

applying a solution containing hydrolyzed and condensed titanium alkoxide to the surface of a substrate at a substantially ambient temperature to provide a titanium containing gel-film on the surface of the substrate; and heating the substrate in an ammonia atmosphere to a temperature of at least about 700° C., and at a rate of temperature change of at least about 50° C. per minute for a time sufficient to form a substantially stoichimetric film of titanium nitride.

2. A method according to claim 1 wherein the step of heating the substrate comprises heating the substrate to a temperature of at least about 900° C.

3. A method according to claim 1 wherein the step of heating the substrate comprises heating the substrate at a rate of temperature change of at least about 70° C. per minute.

4. A method according to claim 1 further comprising the step of maintaining the heated substrate at the temperature to which it is heated for a time period sufficient for the substantially stoichiometric titanium nitride film to form.

5. A method according to claim 1 further comprising the step of maintaining the heated substrate at the temperature to which it is heated for between about thirty minutes and one hour.

6. A method according to claim 1 further comprising the step of cooling the heated substrate to substantially ambient temperature at a rate of temperature change substantially equal to the rate of temperature change used to heat the substrate.

7. A method according to claim 1 further comprising the step of predensifying the titanium containing gel-film on the surface of a substrate upon which the titanium alkoxide containing solution has been applied prior to the step of heating the substrate.

8. A method according to claim 7 wherein the step of predensifying the titanium containing gel-film comprises:
heating the substrate upon which the titanium alkoxide containing solution has been applied to provide a gel-film containing titanium on the surface of the substrate to a temperature of from about 400° C. to about 900° C. by rapid thermal annealing so that the rate of temperature change exceeds about 1000° C. per minute in hydrogen gas;
maintaining the heated substrate at the temperature to which it is heated for at least about 1 second to about 60 minutes; and
cooling the heated substrate and densified gel-film to substantially ambient temperature at a rate of temperature change substantially equal to the rate of temperature change used to heat the substrate.

9. A method according to claim 7, wherein the step heating the substrate upon which the titanium containing solution has been applied comprises heating the substrate by rapid thermal annealing.

10. A method according to claim 1 wherein the step of applying a solution containing titanium alkoxide comprises spraying the solution onto the substrate.

11. A method according to claim 1 wherein the step of applying a solution containing titanium alkoxide comprises dipping the solution onto the substrate.

12. A method according to claim 1 wherein the step of applying a solution containing titanium alkoxide comprises spin coating the solution onto the substrate.

13. A method according to claim 12 wherein the step of spin coating the solution onto the substrate comprises the step of pouring the solution on the substrate and spinning the substrate at rate of about 1000 to 6000 rpm.

14. A method according to claim 1 wherein the step of applying a solution containing titanium alkoxide to the surface of a substrate comprises the step of applying the solution to the surface of a metal substrate.

15. A method according to claim 1 wherein the step of applying a solution containing titanium alkoxide to the surface of a substrate comprises the step of applying the solution to the surface of a non-metal substrate.

16. A method according to claim 15 wherein the step of applying a solution containing titanium alkoxide to the surface of a non-metal substrate comprises the step of applying the solution to the surface of a silicon wafer.

17. A method according to claim 1 wherein the step of applying a solution containing titanium alkoxide to the surface of a substrate comprises the step of applying the solution to the surface of a ceramic substrate.

18. A method according to claim 1 wherein the step of applying a solution containing titanium alkoxide to the surface of a substrate comprises the step of applying the solution to the surface of a glass substrate.

19. A method according to claim I wherein the step of applying a solution containing titanium alkoxide to the surface of a substrate comprises the step of applying the solution to the surface of a polymer substrate.

20. A method according to claim 1 wherein the step of heating the substrate in an ammonia atmosphere comprises the step of heating the substrate in an ammonia atmosphere of at least about 99.99% ammonia.

21. A method of producing a substantially stoichiometric film of titanium nitride on the surface of a substrate in which the film is particularly suitable for diffusion barriers and planarization and interconnect materials in electronic devices, the method comprising:
applying a solution of hydrolyzed and condensed titanium alkoxide in solvent, in which the titanium alkoxide has the formula $Ti(OR)_4$, wherein R is an alkyl group having 1 to 6 carbon atoms, and in which the solvent is selected from the group consisting of aliphatic, cycloaliphatic and aromatic compounds containing from 1 to 20 carbon atoms and at least one functional group consisting of ether and hydroxyl, to the surface of a substrate at a substantially ambient temperature to provide a gel-film containing titanium on the surface of the substrate; and
heating the substrate in an ammonia atmosphere to a temperature of at least about 700° C., and at a rate of temperature change of at least about 50° C. per minute for a time sufficient to form a substantially stoichimetric film of titanium nitride.

22. A method according to claim 21 wherein the step of applying a solution of titanium alkoxide in solvent comprises the step of applying a solution of titanium alkoxide in which the titanium alkoxide has the formula $Ti(OR)_4$, wherein R is an alkyl group having 2 to 4 carbon atom s, and in which the solvent is selected from the group consisting of $C_2$–$C_5$ saturated or unsaturated alcohols.

23. A method according to claim 21 wherein the step of applying a solution of titanium alkoxide in solvent comprises the step of applying a solution of titanium alkoxide in which the titanium alkoxide is selected from the group consisting of titanium (IV) ethoxide, titanium (IV) n-propoxide, titanium (IV) i-propoxide, titanium (IV) n-butoxide, titanium (IV) s-butoxide, and titanium (IV) t-butoxide, titanium(IV) isoamyloxide and titanium (IV) n-capryloxide, and in which the solvent is selected from the group consisting of ethanol, n-propanol, 2-propanol, n-butanol, sec-butanol, t-butanol, vinyl alcohol, allyl alcohol, crotyl alcohol, 1-butene-4-ol, 3-butene-2-ol, methanol, cyclohexanol, dibutylether, phenol, benzyl alcohol, tertahydrafuran and dodecanol.

24. A method according to claim 21 wherein the step of applying a solution containing titanium alkoxide in solvent to the surface of a substrate comprises the step of applying a solution of titanium (IV) ethoxide and t-butanol.

25. A method according to claim 21 wherein the step of applying a solution of titanium alkoxide in solvent comprises the step of applying a solution of titanium alkoxide in solvent in which the solvent comprises from about 40% to about 90% by volume of the solution.

26. A method according to claim 21 further comprising the step of adding between about 0.001 and 2 moles of an acid per mole of alkoxide to the titanium alkoxide solution before applying the solution to the surface of a substrate.

27. A method according to claim 26 wherein the step of adding an acid to the titanium alkoxide solution comprises the step of adding an acid selected from the group consisting of hydrochloric acid, nitric acid and acetic acid.

28. A method according to claim 21 further comprising the step of heating the substrate on which the titanium alkoxide solution has been applied to a temperature of about 10° C. to about 70° C. for a time period of about 0.5 to about 48 hours prior to the step of heating the substrate in ammonia.

29. A method according to claim 21 further comprising the step of heating the substrate on which the titanium alkoxide solution has been applied to a temperature of about 25° C. to about 65° C. for a time period of about 0.75 to about 2.5 hours prior to the step of heating the substrate in ammonia.

30. A method of producing a substantially stoichiometric film of titanium nitride on the surface of a substrate in which the film is particularly suitable for diffusion barriers and planarization and interconnect materials in electronic devices on the surface of a substrate, the method comprising:

applying a solution containing a hydrolyzed and condensed titanium alkoxide in solvent, in which the titanium alkoxide has the formula Ti(OR)$_4$, wherein R is an alkyl having 1 to 6 carbon atoms, and in which the solvent is selected from the group consisting of aliphatic, cycloaliphatic and aromatic compounds containing from 1 to 20 carbon atoms and at least one functional group consisting of ether and hydroxyl, to the surface of a substrate at a substantially ambient temperature to provide a titanium-containing gel-film on the surface of the substrate;

predensifying the titanium containing gel-film on the surface of a substrate upon which the titanium containing solution has been applied;

cooling the predensified gel-film on the surface of the substrate to substantially ambient temperature;

heating the substrate in an ammonia atmosphere to a temperature of at least about 700° C. and at a rate of temperature change of at least about 50° C. per minute;

maintaining the heated substrate at the temperature to which it is heated for at least about thirty minutes to about six hours; and cooling the heated substrate to substantially ambient temperature at a rate of temperature change substantially equal to the rate of temperature change used to heat the substrate.

31. A method of producing a substantially stoichiometric film of titanium nitride on the surface of a substrate in which the film is particularly suitable for diffusion barriers and planarization and interconnect materials in electronic devices, the method comprising:

applying a solution containing hydrolyzed and condensed titanium (IV) ethoxide and t-butanol to the surface of a substrate at a substantially ambient temperature to provide a gel-film containing titanium on the surface of the substrate;

predensifying the titanium containing gel-film on the surface of a substrate upon which the titanium containing solution has been applied by heating the substrate to a temperature of from about 400° C. to about 900° C. by rapid thermal annealing so that the rate of temperature change exceeds about 1000° C. per minute in hydrogen gas;

cooling the heated predensified gel-film on the surface of the substrate to substantially ambient temperature at a rate of temperature change substantially equal to the rate of heating;

heating the substrate in an ammonia atmosphere to a temperature of at least about 900° C. and at a rate of temperature change of at least about 70° C. per minute;

maintaining the heated substrate at the temperature to which it is heated for between about thirty minutes and one hour; and cooling the heated substrate to substantially ambient temperature at a rate of temperature change substantially equal to the rate of temperature change used to heat the substrate.

32. A method of producing a substantially stoichiometric film of titanium nitride on the surface of a substrate in which the film is particularly suitable for diffusion barriers and planarization and interconnect materials in electronic devices, the method comprising:

heating a substrate upon which a hydrolyzed and condensed solution containing titanium has been applied at a substantially ambient temperature to provide a gel-film containing titanium on the surface of the substrate, and in an ammonia atmosphere to a temperature of at least about 700° C., and at a rate of temperature change of at least about 50° C. per minute for a time sufficient to form a substantially stoichimetric film of titanium nitride.

33. A method according to claim 32 further comprising the step of predensifying the titanium containing the gel-film on the surface of a substrate upon which the titanium containing solution has been applied prior to the step of heating the substrate.

* * * * *

UNITED STATES PATENT AND TRADEMARK OFFICE
CERTIFICATE OF CORRECTION

PATENT NO. :      5,202,152
DATED      :      April 13, 1993
INVENTOR(S) :     Giannelis et al.

It is certified that error appears in the above-identified patent and that said Letters Patent is hereby corrected as shown below:

On the title page item [75], delete

"Y. Y. Shacham-Diamond" and substitute --Y. Y. Shacham-Diamand-- therefor.

Signed and Sealed this

Thirty-first Day of October 1995

Attest:

BRUCE LEHMAN

Attesting Officer

Commissioner of Patents and Trademarks